United States Patent [19]

Webster et al.

[11] Patent Number: 4,617,553
[45] Date of Patent: Oct. 14, 1986

[54] ENHANCED MILLER CODE

[75] Inventors: Mark A. Webster; Richard D. Roberts, both of Palm Bay, Fla.

[73] Assignee: Harris Corporation, Melbourne, Fla.

[21] Appl. No.: 764,681

[22] Filed: Aug. 12, 1985

[51] Int. Cl.$^4$ .............................................. H03M 5/14
[52] U.S. Cl. .............................. 340/347 DD; 360/40
[58] Field of Search ............ 340/347 DD; 360/40-44; 375/19; 371/55

[56] References Cited

U.S. PATENT DOCUMENTS

| | | | |
|---|---|---|---|
| 3,108,261 | 10/1965 | Miller | 340/174.1 |
| 3,631,471 | 12/1971 | Griffiths | 340/347 DD |
| 3,810,111 | 5/1974 | Patel | 340/172.5 |
| 3,905,029 | 9/1975 | McIntosh | 340/347 DD |
| 4,027,335 | 5/1977 | Miller | 360/40 |
| 4,183,066 | 1/1980 | Anderson | 360/40 |
| 4,227,184 | 10/1980 | Howells | 340/347 |
| 4,234,897 | 11/1980 | Miller | 360/45 |
| 4,309,694 | 1/1982 | Henry | 340/347 DD |
| 4,326,282 | 4/1982 | Verboom | 369/48 |
| 4,410,877 | 10/1983 | Carasso | 340/347 DD |
| 4,414,659 | 11/1983 | Beckers | 369/59 |

OTHER PUBLICATIONS

Taub "Elimination of DC Component in MFM-Type Codes", IBM Technical Disclosure Bulletin, vol. 21, No. 1, Jun. 1978, pp. 361-362.

Mallison and Miller article, "Optical Codes for Digital Magnetic Recording", from the Radio and Electronic Engineer, vol. 47, No. 4, pp. 172-176, Apr. 1977.

Primary Examiner—Charles D. Miller
Attorney, Agent, or Firm—John L. DeAngelis, Jr.

[57] ABSTRACT

An encoded signal free of dc content is provided by modifying the Miller encoding scheme for digital data streams. The digital data stream is broken up into a sequence of blocks delineated by a one-to-zero transition at the beginning of each block. Each block is further subdivided such that the first half contains only zeros and the second half contains only ones. The number of zeros and ones are counted and novel encoding rules are applied depending on whether the number of ones and zeros is odd or even. If both the number of zeros and ones is even or odd, or the number of zeros is even and the number of ones is odd, encoding is accomplished using standard Miller rules. If the number of zeros is odd and the number of ones is even, Miller rules are used except the last one in the group is ignored. When both the number of zeros and ones is odd, special encoding rules are applied to the next block, dependent on the content of the next block.

7 Claims, 25 Drawing Figures

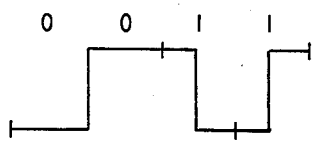
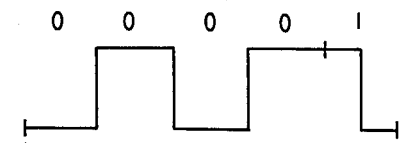
FIG. 6            FIG. 7
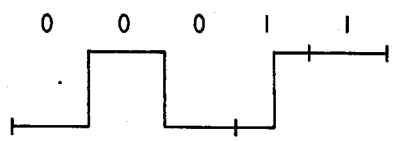
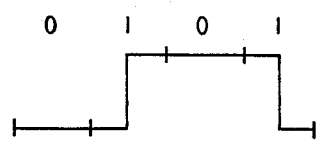
FIG. 8            FIG. 9
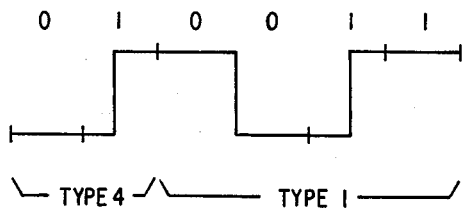
FIG. 10
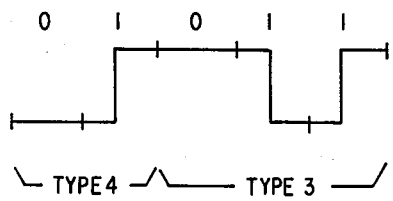
FIG. 11
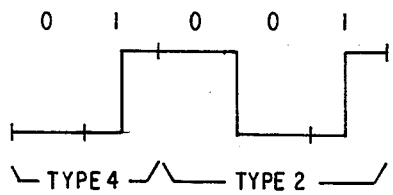
FIG. 12

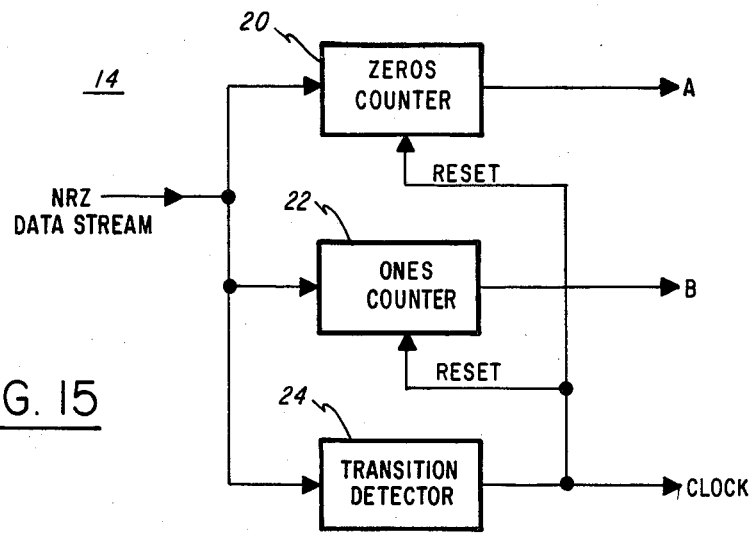
FIG. 16A
FIG. 16B
FIG. 15
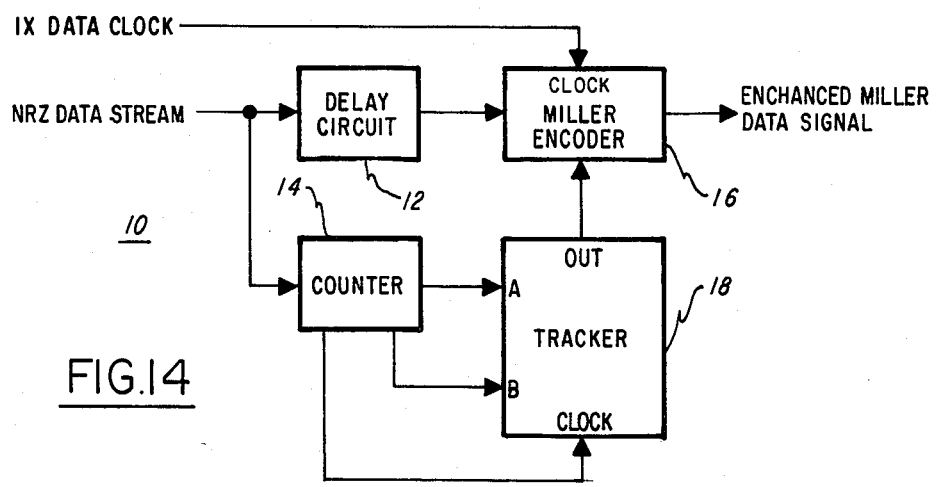
FIG. 14

ENHANCED MILLER CODE

FIELD OF THE INVENTION

This invention relates to an enhanced Miller code for encoding a stream of digital data bits that produces no dc in the encoded signal.

BACKGROUND OF THE INVENTION

Binary data comprises data bits containing information in the form of binary one and binary zero digits. In logic circuits it is common to represent a binary one digit by a predetermined positive voltage and a binary zero digit by a zero or negative voltage. To transfer these data bits or record them on a magnetic tape or optical disk, the data bits are generally modified, by a process known as encoding. Each encoded data bit is accommodated in an interval referred to as a bit cell. This bit cell may be a time interval (in the case of transmission via an information transmission channel) or a spatial interval (in the case of recording on a tape or a disk). There are a variety of objectives for channel encoding and a variety of techniques to satisfy these objectives. For example, it may be desirable to obtain maximum information density in the encoded signal or to eliminate the dc content of the encoded signal without increasing the bandwidth.

One technique for encoding digital data is the non-return-to-zero (NRZ) technique. In NRZ encoding, one bits and zero bits are recorded as positive and negative levels, respectively; transitions in the NRZ signal occur only when the data bit changes. That is, for consecutive one bits an NRZ signal remains in the high state.

Another encoding technique is Miller encoding. The rules for Miller encoding are: (1) each binary one bit is encoded with a transition in the middle of the bit cell; (2) a single zero data bit between two one data bits is ignored, that is, there is no transition associated with single isolated zero bits; and (3) there is a transition at the beginning of the bit cell that separates a pair of zero data bits. Miller encoded data is self-clocking (that is, the clock signal necessary for decoding can be obtained directly from the encoded data signal), and has a bandwidth similar to an NRZ encoded data signal, but decoding Miller-encoded data requires a clock running at twice the data rate. A Miller encoded signal also has a dc content, whose magnitude can vary between zero volts and one-third the voltage representing a binary one bit, depending on the bit pattern.

It is advantageous to remove the dc content because there are low frequency limits for transmitting such a waveform through capacitive or inductive coupling circuits or through the magnetic field of a magnetic recording device. For example, when a series of pulses is transmitted through a capacitive coupling circuit the charge on the capacitor accumulates with the dc component of the waveform and therefore the output pulses gradually degenerate. Eliminating the dc content also simplifies circuit design by, for example, eliminating the need for dc coupling between circuit stages.

One technique for modifying the Miller-encoding scheme is disclosed in U.S. Pat. No. 3,810,111 issued to A.M. Patel and entitled "Data Coding With Stable Base Line For Recording And Transmitting Binary Data." An article appearing in *The Radio and Electronic Engineer*, Volume 47, No. 4, pp 172–176, Apr. 1977, by J. C. Mallinson and J. W. Miller, discusses the Patel encoding scheme disclosed in the Patel patent. The article notes that any data stream may be considered a series of sequences of two types:

(a) 011110; n ones bounded by zeroes, with n greater than or equal to zero, and (b) 111111; m ones.

Under Miller-coding rules, sequences of type (a) with n even and non-zero, have a non-zero dc value, which upon concatenation with interleaving type (b) sequences, can be maintained indefinitely. While other sequences, that is type (a) sequences with n odd or zero, or type (b) have zero dc content. In the Patel scheme, for all sequences with n even and non-zero all zeroes are encoded in the standard Miller fashion; the ones are encoded as though they were zeroes but with alternate transitions deleted. With this coding scheme the dc content is zero at the end of each sequence. All other data sequences are coded under standard Miller rules. Because the data within each sequence has to be altered, Patel requires an infinite forward-looking and backward-looking memory to identify the sequence boundary and modify the encoding scheme if n is even and non-zero.

The referenced article also discloses another modification of the Miller technique to remove the dc content of the encoded waveform. Like the Patel scheme, this is achieved by modifying data sequences having a non-zero dc content. However, to limit the memory required the changes are introduced only at the end of the sequence. Accordingly, in the sequences having n even and non-zero, all the ones are encoded according to the normal Miller rules, but the last one is simply ignored. All other sequences are coded by the standard Miller rules. For modified sequences having a final zero, the final zero is counted as part of the following sequence.

U.S. Pat. No. 4,414,659 issued to Beckers and entitled "Method And Apparatus For Encoding Digital Data So As To Reduce The D.C. And Low Frequency Content Of The Signal" discloses yet another encoding scheme based upon the Miller scheme. The scheme by Beckers uses the type (a) and (b) sequences discussed above in conjunction with the patent to Patel. But, in contrast to the Patel scheme, only the first two one bits of a type (a) sequence where n is even are modified by encoding the two one bits with a transition at the boundary between them. The remaining one bits of a type (a) word with n even are encoded in accordance with normal Miller rules. Alternatively, Beckers also discloses another modification to the Miller-encoding scheme where only a single specific sequence type is detected, namely a sequence comprising a single zero followed by an even number of ones. Each sequence of this type is modified regardless of its position within the data stream. The modification comprises changing the first two one bits such that there is a signal transition between them. The dc content for each sequence using this scheme is also zero.

SUMMARY OF THE INVENTION

All NRZ data streams can be broken up into sequences of digital data blocks with adjacent blocks delineated by an NRZ one-to-zero transition. Each block can be further subdivided into two halves, with the first half containing only zero bits and the second half containing only one bits. According to the principles of the present invention, the blocks are classified depending on whether the number of zeros is odd or even and whether the number of ones is odd or even. Thus, there are four block types. According to the present invention, blocks containing an even number of zeros and ones, and blocks containing an even number of zeros and an odd number of ones are coded using the standard Miller rules. Blocks containing an odd number of zeros and an even number of ones are encoded according to the Miller rules, but the last one is ignored. Blocks containing an odd number of zeros and an odd number of ones are encoded according to the standard Miller rules. Also, special rules apply for encoding a block immediately following one with an odd number of ones and zeros. Elimination of the dc content by using this unique encoding scheme simplifies circuit design by eliminating the need for dc coupling.

BRIEF DESCRIPTION OF THE DRAWINGS

The present invention may be better understood, and the further advantages and uses thereof more readily apparent, when considered in view of the following detailed description of exemplary embodiments, taken with the accompanying drawings in which:

FIGS. 6 through 12 illustrate the encoding scheme for the various block classifications of FIG. 5;

FIG. 14 a block diagram of an encoder constructed according to the principles of the present invention;

FIG. 15 is a block diagram of the counter of FIG. 14;

FIGS. 16A and 16B illustrate the operation of the counter of FIG. 12;

DESCRIPTION OF THE PREFERRED EMBODIMENTS

Figure 1:
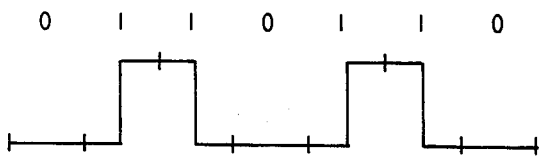
FIG. 1 illustrates a digital data stream encoded according to the prior art Miller encoding scheme.

FIG. 1 illustrates a data stream encoded according to the standard Miller scheme. As is well known, under the Miller rules a data one is coded with a transition in the middle of the bit cell; there is no transition for isolated data zeros; and transitions are inserted at the beginning of the bit cell between pairs of data zeros. The data stream illustrated in FIG. 1 is encoded according to these rules.

Figure 2:
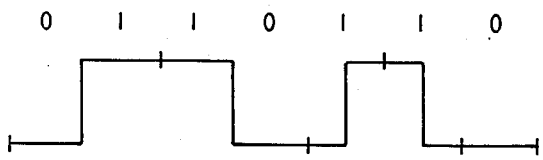
FIG. 2 illustrates a digital data stream encoded according to the prior art Patel scheme disclosed in U.S. Pat. No. 3,810,111.

FIG. 2 illustrates the coding scheme developed by Patel as previously discussed. According to Patel, any data stream may be considered a series of sequences of two types:

(a) 011110; n ones bounded by zeros where n is greater than or equal to zero, and;

(b) 111111; m ones

For sequences of type (a) with n even, the ones are encoded as though they were zeros but with alternate transitions deleted. This is illustrated in FIG. 2. All other sequences, that is type (a) with n odd or zero, and all type (b), are encoded according to the standard Miller rules. As can be seen, the dc content of the data stream of FIG. 2 is zero.

Figure 3:
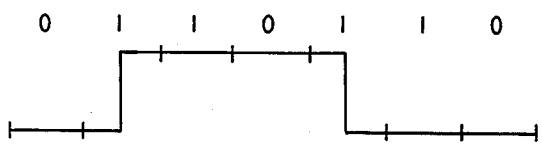
FIG. 3 illustrates a first data stream encoded according to the prior art modified-Miller rules disclosed in *The Radio And Electronic Engineer* article previously discussed.
Figure 4:
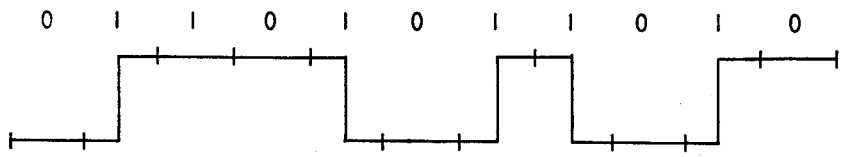
FIG. 4 illustrates a second data stream encoded according to the prior art modified Miller rules disclosed in the aforementioned article.

FIGS. 3 and 4 illustrate data streams encoded according to the modified Miller technique discussed in the article appearing in the *The Radio And Electronic Engineer* and previously discussed. Again, the objective is to remove the dc content and this is accomplished by modifying the type (a) sequences with n even by simply ignoring the last data one. All other sequences are coded by standard Miller rules. FIGS. 3 and 4 illustrate this technique and as can be seen the dc content of both the FIG. 3 and the FIG. 4 encoded data streams is zero.

According to the principles of the present invention, all NRZ (non-return to zero) data streams can be separated into sequences of data blocks, with two adjacent data blocks delineated by an NRZ one-to-zero transition. Further, each data block can be subdivided into two halves, with the first half containing only data zeros and the second half containing only data ones. Based upon whether the number of zeros is odd or even, and upon whether the number of ones is odd or even, a block can be classified into one of four categories.

TABLE 1

| Block Type | No. of Zeros | No. of Ones |
|---|---|---|
| 1 | Even | Even |
| 2 | Even | Odd |
| 3 | Odd | Even |
| 4 | Odd | Odd |

Figure 5:
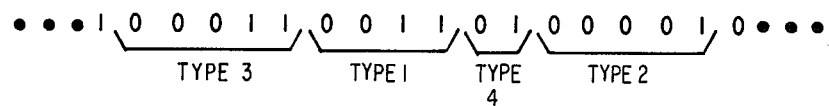
FIG. 5 illustrates a data stream segregated according to the block classifications of the present invention.

FIG. 5 shows a portion of exemplary binary data stream that has been broken up into data blocks and each block classified according to Table 1.

A Miller-encoded data one has no dc content because there is a transition at mid-bit. Therefore, the all-ones half of any data block contains no dc. Also, two adjacent zeros contain no dc because a transition separates them. This concept extends to any even number of zeros in any data block since there are an equal number of highs and lows associated with these zeros. However, an odd number of data zeros possesses dc since there is either an extra high or an extra low state. Therefore, the type one and two data blocks do not generate dc; the type-three and type-four data blocks of Table 1 generate dc.

According to the inventive principles, blocks of type-one and type-two are encoded with the standard Miller rules. FIGS. 6 and 7 illustrate encoding of type-one and type-two blocks respectively. To remove the dc from a type-three data block the last one is ignored (i.e., held at the same level as the last half of the preceding one). This technique, which removes the dc content from a type-three data block is illustrated in FIG. 8.

Removing the dc from a type-four data block requires the use of a subsequent data block to add a dc component opposite in polarity to the dc generated by the type-four block. Because only one of the four block types can immediately follow the type four block of concern, each such combination must be analyzed individually.

If a second type-four data block immediately follows the first type-four data block, and both are encoded according to standard Miller roles, the dc offset corrects itself. This is illustrated in FIG. 9. The second type-four block generates a dc component opposite in polarity to the dc component generated by the first type-four block, thus the dc components cancel each other.

If a type-one data block follows the type-four data block, the dc content remains unchanged because a type-one block has no dc. However, if the last one in the type-one data block is ignored during Miller encoding, a dc component is created that offsets the dc component of the type-four data block. (The type four data block is encoded using standard Miller encoding.) This case is illustrated in FIG. 10.

A type-three data block following a type-four data block is illustrated in FIG. 11. In this situation the type-three data block is encoded using the standard Miller rules to nullify the dc generated by the type-four data block, which is also encoded with the standard Miller rules. As previously discussed, when a type-three data block does not follow a type-four data block the type 3 block is encoded using the standard Miller rules but the final one is ignored.

Lastly, it is possible to have a type-two data block follow the type-four data block. This situation is illustrated in FIG. 12. A type-two data block contains no dc and produces the same output condition as it receives as an input from a preceding block, and itself produces no dc. In particular, if the last half of the one bit preceding the type-two data block is high, the last half of the terminating one of the type-two data block is also high. Therefore, if a dc component exists at entry to the type-two data block, the same dc component exists when the type-two data block is exited. In other words, the type-two data block is totally transparent with respect to the dc content of the data stream. A type-one, three, or four data block following the type-two data block will therefore have the same effect on the dc component as if the type-two data block did not exist, that is, as if the type-one, three, or four data block followed the orginal type-four data block directly. Consequently, a stream of one or more type-two data blocks following a type-four data block allows the next type-one, three, or four data block to correct the dc problem in the same manner as discussed above. The preceding encoding rules are summarized in Table 2 and 3 below.

TABLE 2

ENHANCED-MILLER ENCODING SCHEME

| Block Type | Encoding Scheme |
|---|---|
| 1 | Miller |
| 2 | Miller |
| 3 | Miller, but ignore last one |
| 4 | Miller |

TABLE 3

ENHANCED-MILLER ENCODING SCHEME FOR BLOCKS IMMEDIATELY FOLLOWING A TYPE-FOUR BLOCK OR FOR DATA BLOCKS SEPARATED FROM A PRECEDING TYPE-FOUR BLOCK ONLY BY TYPE-TWO BLOCKS

| Block Type | Encoding Scheme |
|---|---|
| 1 | Miller, but ignore last one |
| 2 | Miller |
| 3 | Miller |
| 4 | Miller |

Figure 13A:
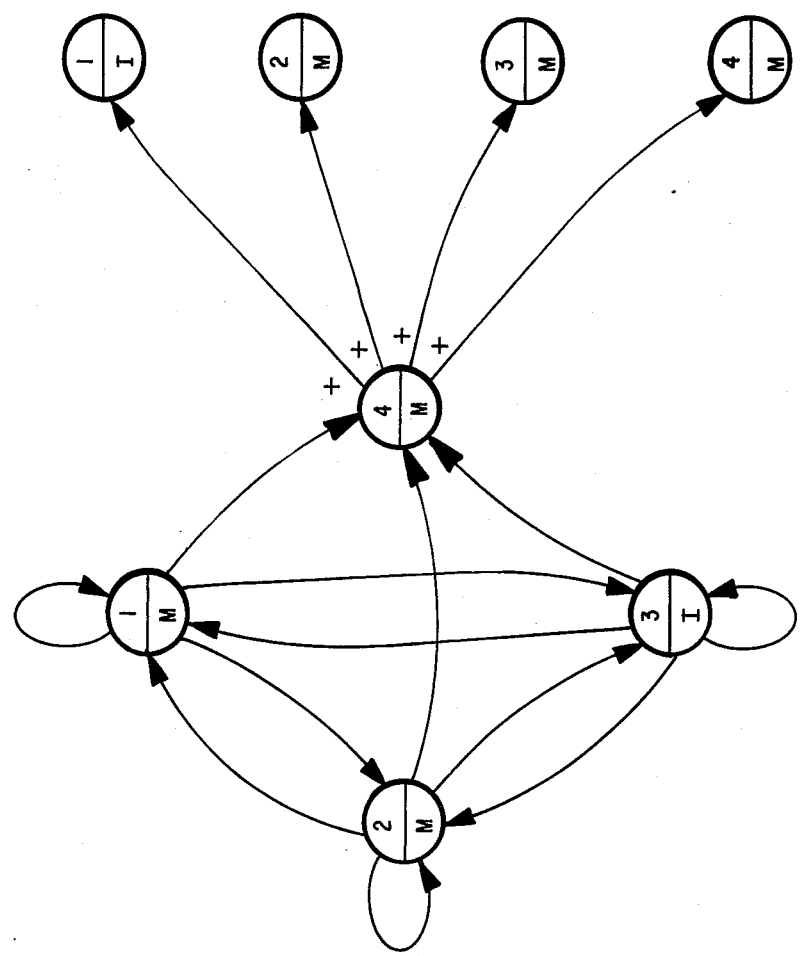
FIGS. 13A and 13B illustrate an algorithm for the encoding scheme of the present invention.
Figure 13B:
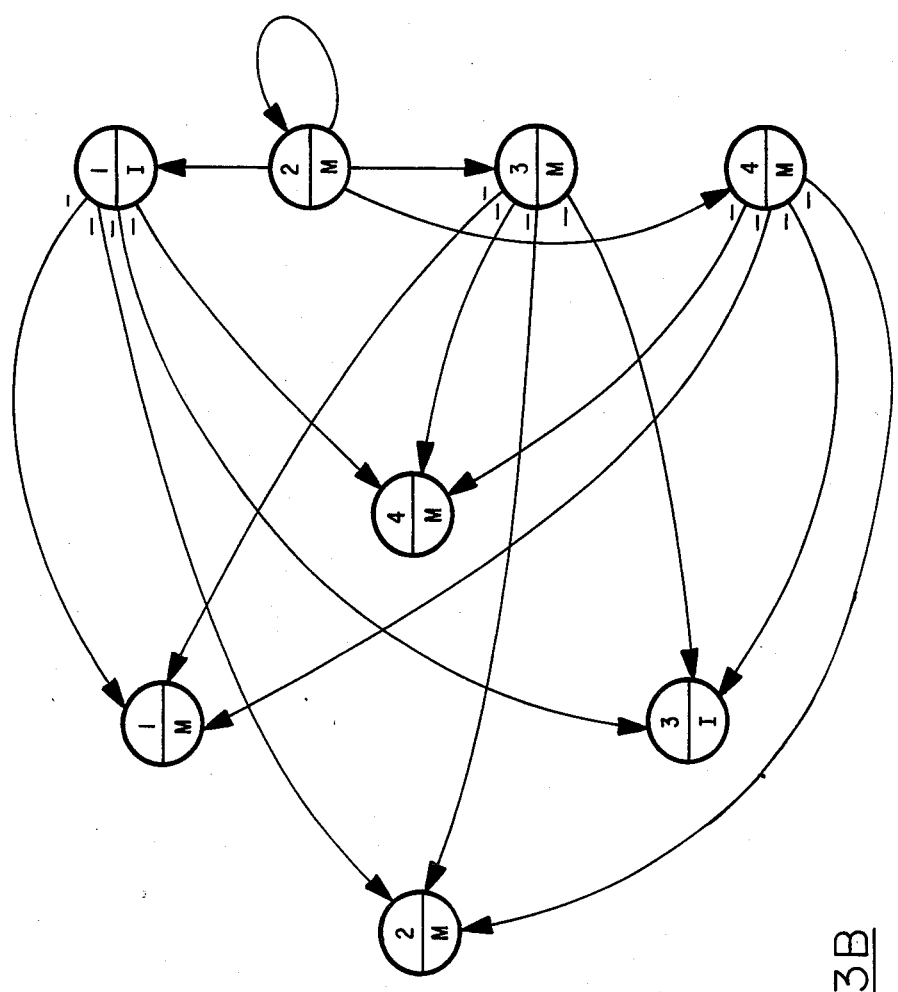

FIGS. 13A and 13B illustrate the principles of the present invention in the form of a state diagram. The number in the top half of each bubble specifies the data block type to be transmitted. The letter in the bottom half of each bubble specifies the type of encoding to be executed on the given block. An "M" denotes standard Miller encoding, and an "I" denotes standard Miller encoding with the last one in the block ignored. (See FIG. 8 for an example of the latter.) The arrow originating at each bubble terminates at the bubble representing the next data block in the data stream. FIGS. 13A and 13B must be used together to cover all the possible permutations of the four block types. A "+" next to an arrow indicates that the exited block has produced a dc component of one polarity, and a "−" next to the arrow indicates that the exited block has produced a dc component of the opposite polarity. The lack of a symbol next to an arrow signifies that no dc component was generated. By progressing through the state diagram, the dc component can be determined by summing the "+" and "−" adjacent to the traversed arrows.

FIG. 14 illustrates one embodiment of an encoder 10 for encoding an NRZ data stream in accord with the principles of the present invention. The NRZ data stream is input to a delay circuit 12 and a counter 14. The counter 14 counts the number of zeros and ones, and produces signals indicating whether the number of ones and zeros is odd or even. The counter 14 also supplies a clock signal to a tracker 18 at a clock input terminal. A signal indicating whether the number of zeros is odd or even is supplied as an input to terminal A of the tracker 18. A signal indicating whether the number of ones is odd or even is input to a terminal B of the tracker 18. The output signal from the delay circuit 12 is applied as an input to a Miller encoder 16 at a terminal X thereof. The delay circuit 12 compensates for propagation delay through the counter 14 and the tracker 18. A signal from the tracker 18 is supplied as an input to a terminal Y of the Miller encoder 16. This signal indicates whether the final one in a data block is to be ignored as previously discussed. The Miller encoder 16 is also responsive to a 1X data clock signal. The Miller encoder 16 is of the well-known type, modified to ignore the last one of a data block when the signal from the tracker 18 so indicates. The output signal from the Miller encoder 16 represents the NRZ data stream encoded according to the principles of the present invention, and is designated "Enhanced-Miller Data Signal" in FIG. 14.

Figure 17:
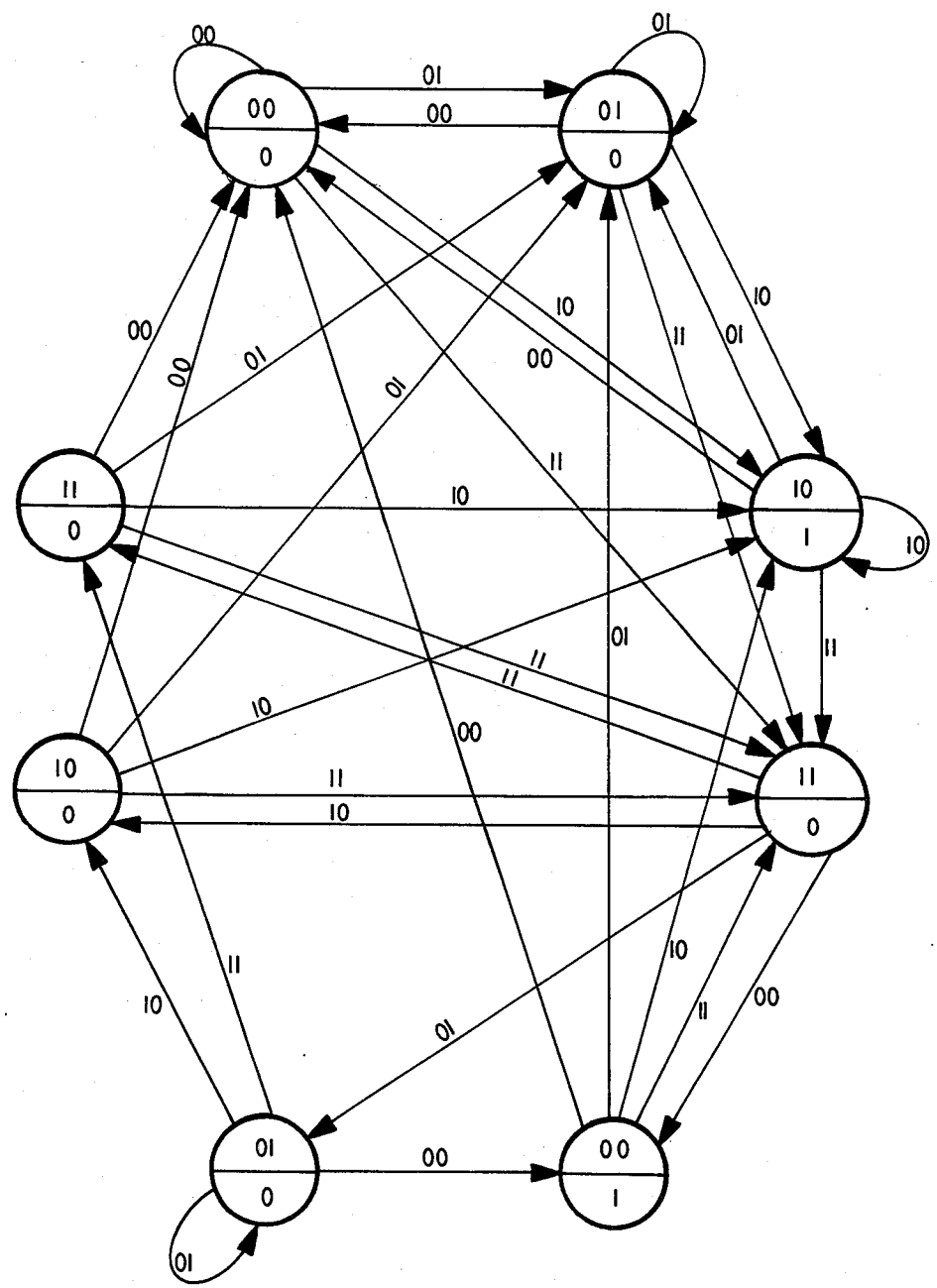
FIG. 17 a state diagram for implementing the encoding scheme of the present invention.

The tracker 18 implements the state diagram shown in FIG. 17. The top portion of each bubble in FIG. 17 represents the current state of the tracker and the bottom number in each bubble represents the tracker output signal that is provided to the terminal Y of the Miller encoder 16. When the output signal from the tracker 18 is a binary zero, the Miller encoder performs the encoding function according to the standard Miller rules. When the output from the tracker 18 is a binary one, the Miller encoder 16 ignores the last one of the data block. The numerals aside each arrow in FIG. 17 indicate the input signals to the tracker 18. The first numeral indicates the signal at the A input terminal, and the second numeral indicates the input signal at the B input terminal. A zero indicates an even number of ones or zeros, and a one indicates an odd number of ones or zeros. As is well known, to implement the state diagram of FIG. 13, the tracker 18 can constitute a plurality of flip-flops or a programmable-array logic device.

FIG. 15 illustrates one embodiment for the counter 14 of FIG. 14. In FIG. 15 the NRZ data stream is supplied as an input to a zeros counter 20, a ones counter 22, and a transition detector 24. In a preferred embodiment, the zeros counter 20 and the ones counter 22 are implemented with flip-flops or any other modulo-2 counter. As illustrated in FIG. 16A, the signal designated A in FIG. 15 is zero when there are an even number of zeros, and is one when there are an odd number of zeros. Similarly, the signal designated B in FIG. 15 is zero when there are an even number of ones, and is one when there are and an odd number of ones. The signals A and B in FIG. 15 are input to the A and B terminals, respectively, of the tracker 18 illustrated in FIG. 14. FIG. 16B illustrates the operation of the transition detector 24. The output signal from the transition detector 24 is low when the NRZ data stream is a zero, a one, or in a transition from a zero to one. The transition detector 24 produces a binary one signal when a transition from a one to a zero is detected in the NRZ data stream. This signal serves as a reset signal for the zeros counter 20 and as a clock signal for the tracker 18, and the ones counter 22, and delineates the end of one data block and the beginning of the next one.

Figure 19:
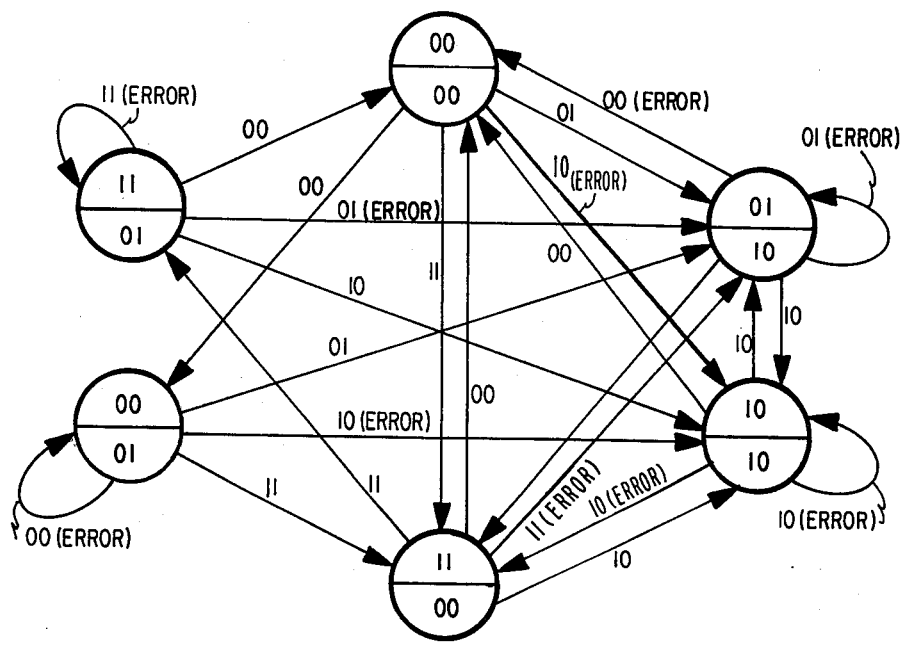
FIG. 19 is a state diagram for the decoder of FIG. 14.
Figure 18:
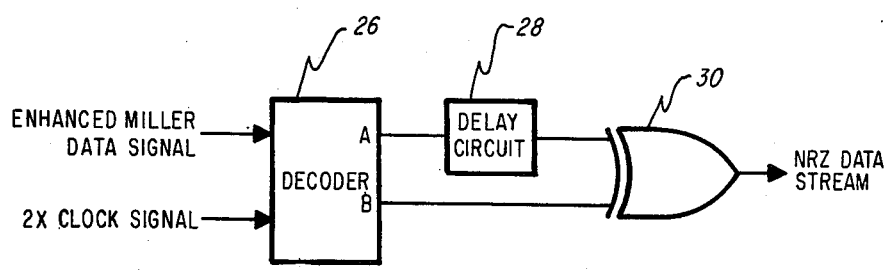
FIG. 18 a block diagram of a decoder constructed according to the teachings of the present invention.

FIG. 18 illustrates one embodiment of a circuit for decoding the enhanced Miller data signal. A decoder 26 is responsive to the enhanced Miller data signal at a first input terminal thereof, and is responsive to a X2 clock signal at a second input terminal thereof. The decoder 26 produces two output signals at terminals designated A and B. The signal from the terminal A is supplied as an input to a delay circuit 28 and then to a first input terminal of an EXCLUSIVE OR gate 30. The terminal B is connected to a second input terminal of the EXCLUSIVE OR gate 30. The delay circuit 28 ensures that the output signal from the terminal B arrives at the EXCLUSIVE OR gate 30 prior to the output signal from the terminal A. The NRZ data stream is produced at an output terminal of the EXCLUSIVE OR gate 30. FIG. 19 illustrates a state diagram that is implemented in the decoder 26. The top two numbers in the bubble are the current state. The bottom two numbers represent the decoder output with the left number being the data output (from the A terminal) and the right number being the invert/non-invert signal (from the B terminal). A one indicates an inversion of the data output will occur and a zero indicates no inversion. The two numbers between the bubbles along the connecting lines represent the data input which occurs two bits at a time. As is well known, the decoder 26 can implement the state diagram with flip-flops or a programmable-array logic device.

Figure 20:
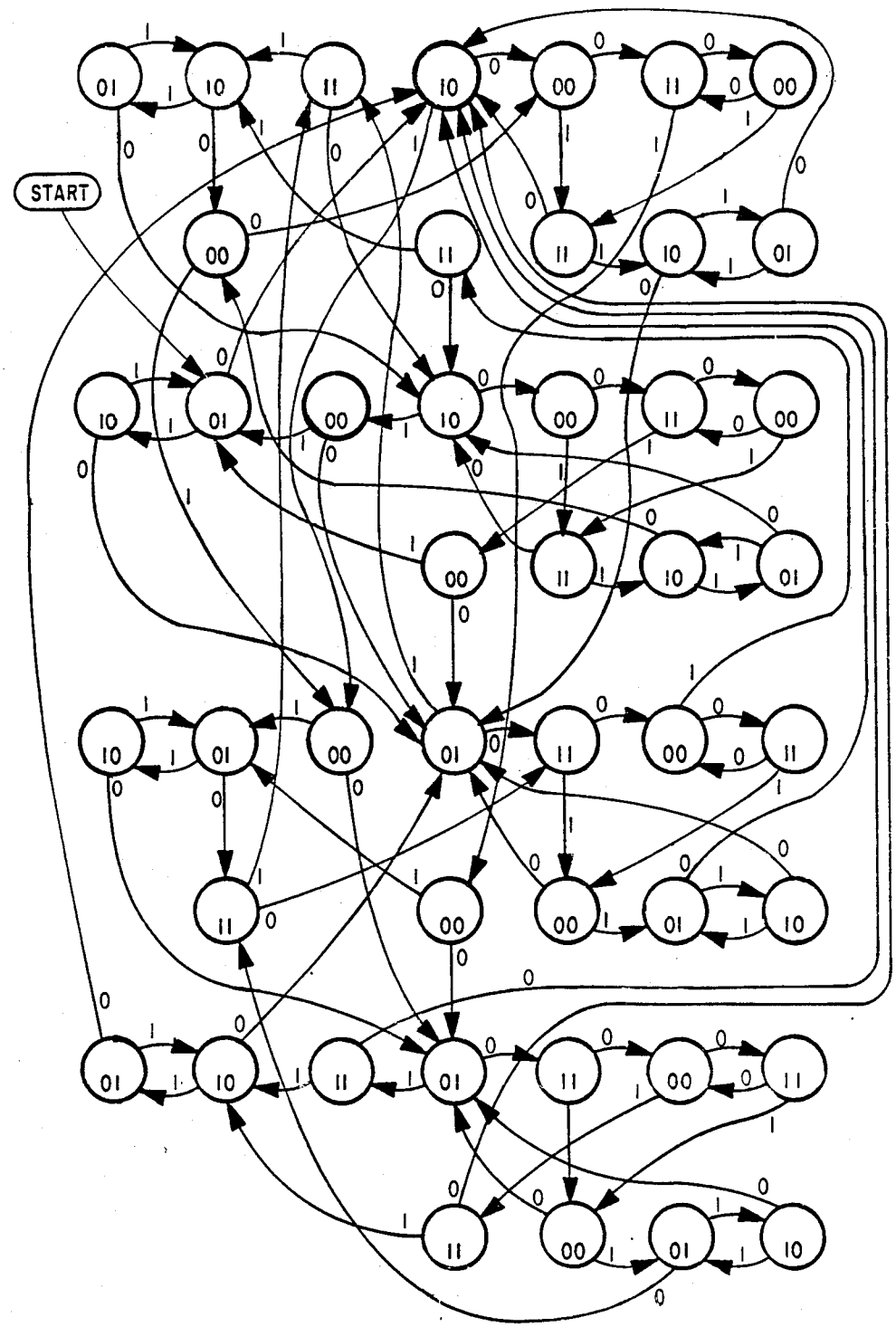
FIG. 20 is a preferred embodiment of a state diagram for implementing the encoding scheme of the present invention.
Figure 21:
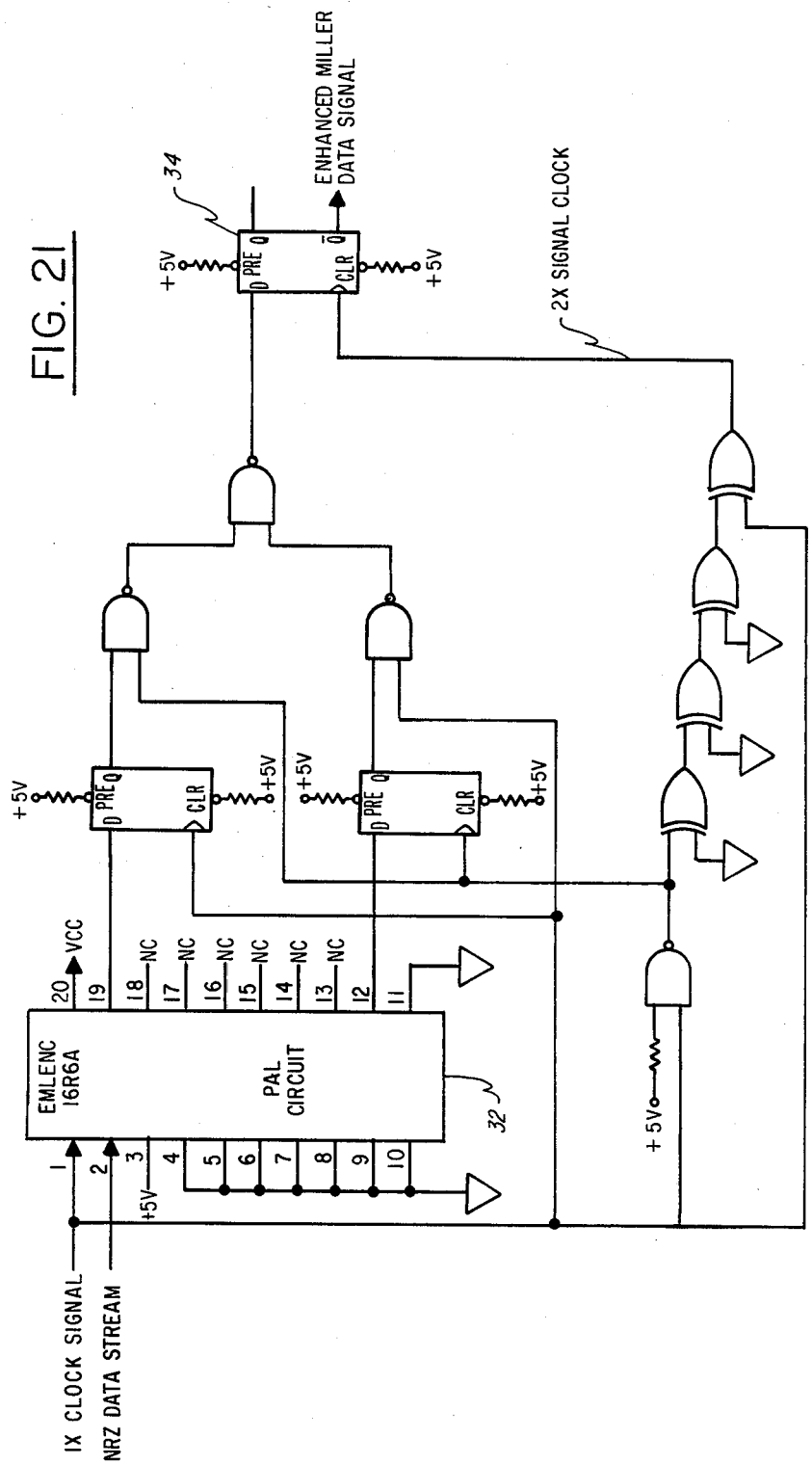
FIG. 21 is a block diagram of a preferred embodiment of an encoder constructed according to the principles of the present invention.

FIG. 20 illustrates another state diagram for encoding NRZ data in accord with the principles of the present invention. This state diagram has been developed using well-known techniques, and can be implemented with a programmable-array logic circuit 32 and corresponding logic devices illustrated in FIG. 21. The 2X clock signal is developed from the rising and falling edges of a 1X clock signal. The rising edge of the 2X clock signal occurs during a stable period of the enhanced-Miller data signal and is latched by a flip-flop 34. The first and second half of each bit cell in the enhanced-Miller data signal is clocked in direct relation to the rising and falling edges of the 1X clock signal. If the 1X clock signal does not have a fifty percent duty cycle, the first and second halves of the enhanced-Miller data signal will likewise not have a fifty percent duty cycle.

Referring to FIG. 20, the two numbers within each bubble indicate the output state. The left-hand number represents phase one of the output and the right-hand number represents phase two of the output. The number beside the interconnecting lines represents the binary input to that state. The output signal of the encoder (i.e., the $\overline{Q}$ terminal of the flip-flop 34) is delayed by one bit period with respect to the input signal. The FIG. 20 state diagram starting point assumes a preamble of NRZ ones.

Figure 22:
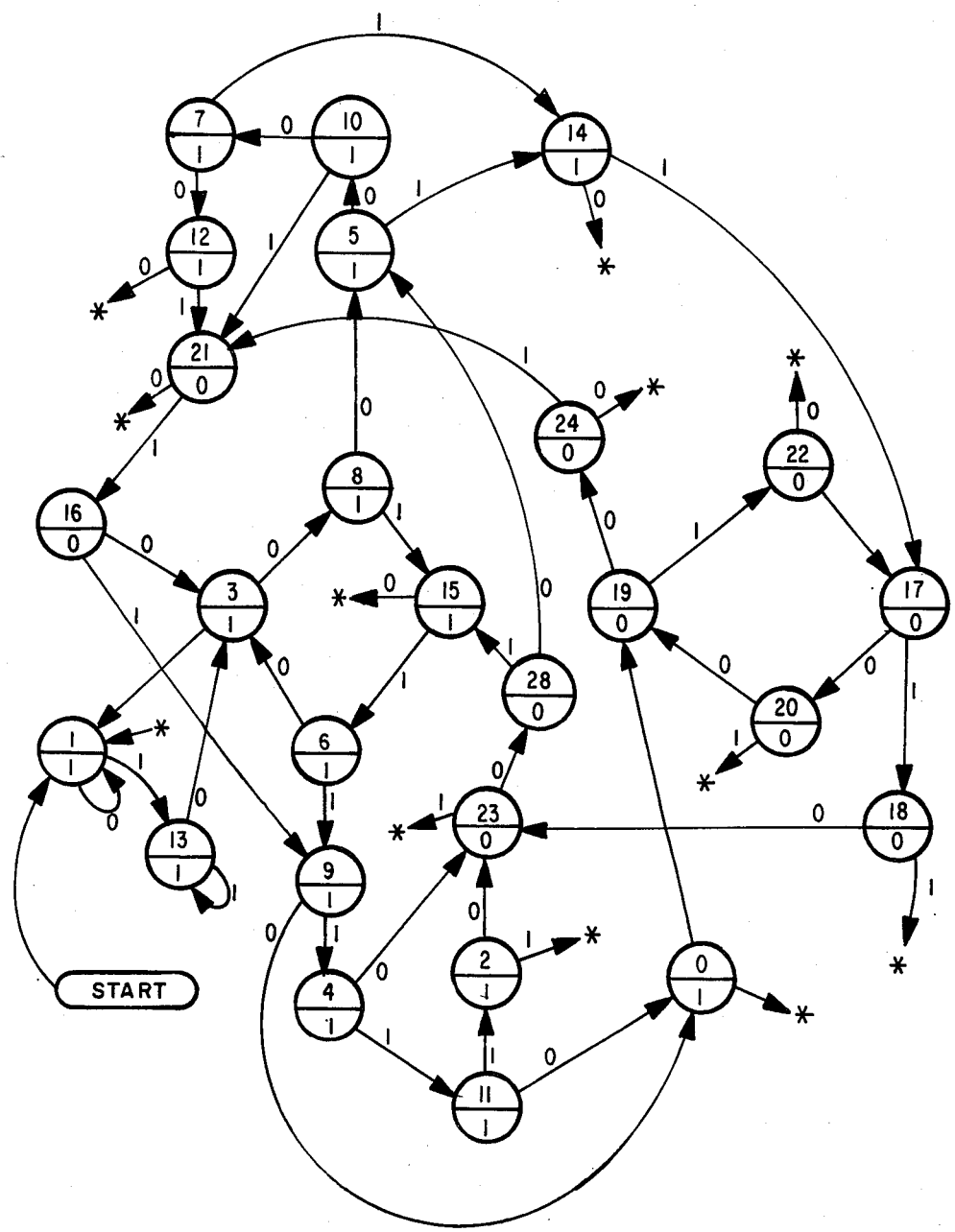
FIG. 22 is a preferred embodiment of a state diagram for decoding data encoded according to the present invention.
Figure 23:
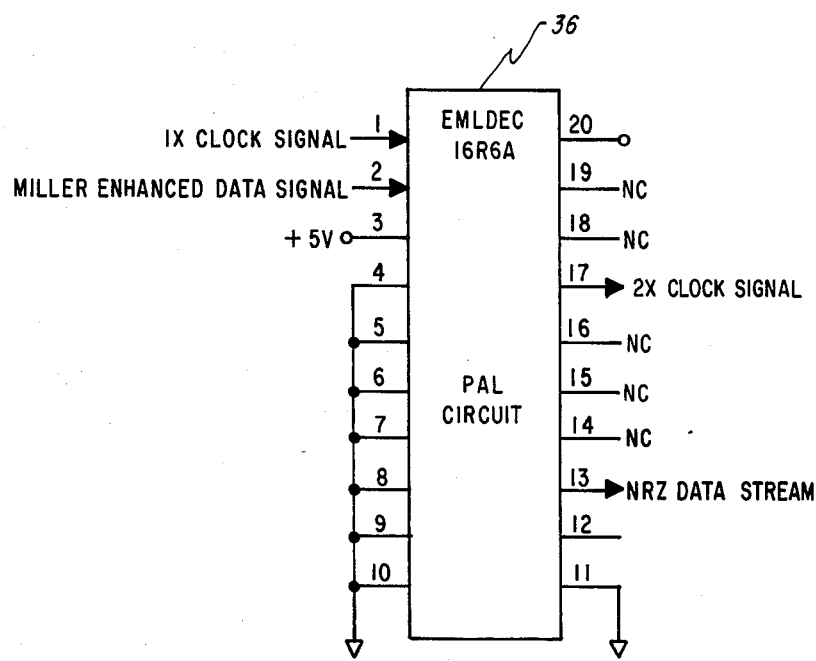
FIG. 23 is a block diagram of a preferred embodiment of a decoder constructed according to the principles of the present invention.

FIG. 22, shows a preferred state diagram for decoding a Miller-enhanced data signal. This is a standard representation for a state diagram well-known to those skilled in the art. Within each bubble there are two numbers. The top numeral represents the state number, and the bottom numeral represents the output signal, i.e., a bit in the NRZ data stream. The number aside the interconnecting arrows in the state diagram represent the encoded input. Notice that the state diagram of FIG. 22 runs at a 2X clockrate; that is, moving from one bubble to the next represents one-half of a bit period. The decoder output is delayed by 1½ bit periods with respect to the input. The state diagram starting point assumes a preamble of Miller encoded ones. As is well known to those skilled in the art, there are many ways to implement the state diagram of FIG. 22, including using a programmable-array logic circuit, such as the programmable-array logic circuit 36 illustrated in FIG. 23.

While several embodiments in accordance with the present invention have been shown and described, it is understood that the same is not limited thereto but is susceptible of numerous changes and modifications as known to a person skilled in the art, and we therefore do not wish to be limited to the details shown and described herein, but intend to cover all such changes and modifications as are obvious to one of ordinary skill in the art.

What is claimed is:

1. A method for encoding digital data represented by a stream of data bits to produce an encoded signal, wherein the stream of data bits includes logical-one data bits and logical-zero data bits which are encoded as signal level transitions or the absence thereof in consecutive bit cells each associated with a respective one of the data bits in the stream of data bits, said method comprising the steps of:
   (a) segregating the stream of data bits into a plurality of consecutive blocks, wherein the beginning of each block is delineated by a signal level transition from one type of data bit to the other
   (b) determining the number of logical-one data bits in each block;
   (c) determining the number of logical-zero data bits in each block;

(d) in response to steps (b) and (c), encoding each block so that there is substantially zero dc content in the encoded signal.

2. The method of claim 1 wherein the beginning of each block is delineated by a signal level transition from a logical-one to a logical-zero data bit.

3. The method of claim 1 wherein the logical-one data bit includes a binary high bit, and wherein the logical-zero data bit includes a binary low bit.

4. The method of claim 1 including the steps of:
(e) in response to step (b), determining whether the number of logical-one data bits is odd or even;
(f) in response to step (c), determining whether the number of logical-zero data bits is odd or even;
(g) in response to steps (e) and (f), designating blocks with an even number of logical-one and logical-zero data bits as block one;
(h) in response to steps (e) and (f), designating blocks with an odd number of logical-one data bits and an even number of logical-zero data bits as block two;
(i) in response to steps (e) and (f), designating blocks with an even number of logical-one data bits and an odd number of logical-zero data bits as block three;
(j) in response to steps (e) and (f), designating blocks with an odd number of logical-one and logical-zero data bits as block four;
(k) encoding each block in the data stream according to the block designation for the block to be encoded, and the block designation for preceding blocks in the data stream.

5. The method claim 4 wherein step (k) includes the steps of:
($k_1$) encoding block one by:
($k_{11}$) encoding each logical-one data bit by a signal level transition at the midpoint of the bit cell associated therewith;
($k_{12}$) encoding each consecutive pair of logical-zero data bits by a signal level transition between the pair of logical-zero data bits;
($k_2$) when a block four immediately precedes a block one or when the preceding block four and the block one are separated only by one or more blocks two, modifying the step ($k_{11}$) by encoding each logical-one data bit of group one, except the last logical-one data bit of the block one, by a signal level transition at the midpoint of the bit cell associated therewith, wherein the last logical-one data bit of the block one is ignored such that there is no transition at the midpoint of the bit cell associated therewith;
($k_3$) encoding block two by:
($k_{31}$) encoding each logical-one data bit by a signal level transition at the midpoint of the bit cell associated therewith;
($k_{32}$) encoding each consecutive pair of logical-zero data bits by a signal level transition between the pair of logical-zero data bits;
($k_4$) encoding block three by:
($k_{41}$) encoding each logical-one data bit, except the last logical-one data bit of the block by a signal level transition at the midpoint of the bit cell associated therewith, wherein the last logical-one data bit of the block is ignored such that there is no transition at the midpoint of the bit cell associated therewith;
($k_{42}$) encoding each consecutive pair of logical-zero data bits by a signal level transition between the pair of logical-zero data bits;
($k_{43}$) ignoring each single logical-zero data bit;
($k_5$) when a block four immediately precedes a block three or when a preceding block four and the block three are separated only by one or more blocks two, modifying the step ($k_{41}$) by encoding each logical-one data bit of block three by a signal level transition at the midpoint of the bit cell associated therewith;
($k_6$) encoding block four by:
($k_{61}$) encoding each logical-one data bit by a signal level transition at the midpoint of the bit cell associated therewith;
($k_{62}$) encoding each consecutive pair of logical-zero data bits by a signal level transition between the pair of logical-zero data bits;
($k_{63}$) ignoring the isolated logical-zero data bits.

6. An apparatus for encoding digital data represented by a stream of data bits including logical-one data bits and logical-zero data bits which are encoded as signal level transitions or the absence thereof in consecutive bit cells each associated with a respective one of the data bits in the stream of data bits, said apparatus comprising:
(a) means for segregating the stream of data bits into a plurality of consecutive blocks, wherein the beginning of each block is delineated by a signal level transition from one type of data bit to the other;
(b) means for determining the number of logical-one data bits in each block;
(c) means for determining the number of logical-zero data bits in each block;
(d) means responsive to the number of logical-one data bits and the number of logial-zero data bits in each block for encoding each block so that there is substantially zero dc content in the encoded signal.

7. The apparatus of claim 6 wherein the beginning of each block is delineated by a signal level transition from a logical-one to a logical-zero data bit.

* * * * *